United States Patent
Ikeda (10) Patent No.: US 9,152,233 B2
(45) Date of Patent: Oct. 6, 2015

(54) TOUCH PANEL SUPPORT STRUCTURE (71) Applicant: SMK Corporation, Tokyo (JP)

(72) Inventor: Ryuji Ikeda, Kanagawa (JP)

(73) Assignee: SMK Corporation, Tokyo (JP)

( * ) Notice: Subject to any disclaimer, the term of this patent is extended or adjusted under 35 U.S.C. 154(b) by 0 days.

(21) Appl. No.: 14/242,887

(22) Filed: Apr. 2, 2014

(65) Prior Publication Data

US 2015/0054756 A1 Feb. 26, 2015

(30) Foreign Application Priority Data

Aug. 22, 2013 (JP) .................. 2013-172585

(51) Int. Cl.
*H05K 7/00* (2006.01)
*G06F 3/01* (2006.01)

(52) U.S. Cl.
CPC . *G06F 3/016* (2013.01); *H05K 7/00* (2013.01)

(58) Field of Classification Search
None
See application file for complete search history.

(56) References Cited

U.S. PATENT DOCUMENTS

| | | | | |
|---|---|---|---|---|
| 4,487,300 | A * | 12/1984 | Hammond | 188/378 |
| 2003/0067449 | A1* | 4/2003 | Yoshikawa et al. | 345/173 |
| 2003/0107300 | A1* | 6/2003 | Nakamura et al. | 310/324 |
| 2006/0109254 | A1* | 5/2006 | Akieda et al. | 345/173 |
| 2006/0192657 | A1* | 8/2006 | Nishimura et al. | 340/407.2 |
| 2008/0246741 | A1* | 10/2008 | Hinata | 345/173 |
| 2008/0252968 | A1* | 10/2008 | Watanabe et al. | 359/446 |
| 2008/0301724 | A1* | 12/2008 | Takasawa | 720/648 |
| 2009/0284485 | A1* | 11/2009 | Colgate et al. | 345/173 |
| 2010/0291974 | A1* | 11/2010 | Lu et al. | 455/566 |
| 2011/0102341 | A1* | 5/2011 | Imai et al. | 345/173 |
| 2011/0148795 | A1* | 6/2011 | Aono et al. | 345/173 |
| 2011/0242055 | A1* | 10/2011 | Kim et al. | 345/175 |
| 2011/0260585 | A1* | 10/2011 | Ichikawa et al. | 310/344 |
| 2011/0304569 | A1* | 12/2011 | Kai et al. | 345/173 |
| 2012/0075221 | A1* | 3/2012 | Yasuda | 345/173 |
| 2012/0147532 | A1* | 6/2012 | Yuan et al. | 361/679.01 |
| 2013/0033657 | A1* | 2/2013 | Li et al. | 349/60 |
| 2013/0106790 | A1* | 5/2013 | Lee | 345/175 |
| 2013/0147930 | A1* | 6/2013 | Hirai | 348/54 |
| 2013/0162581 | A1* | 6/2013 | Ujii | 345/173 |
| 2014/0361935 | A1* | 12/2014 | Jarvis et al. | 343/702 |
| 2014/0367305 | A1* | 12/2014 | Mizuo et al. | 206/585 |

FOREIGN PATENT DOCUMENTS

| | | | |
|---|---|---|---|
| JP | 3798287 B2 | 4/2006 | |
| JP | 4811965 B2 | 9/2011 | |

* cited by examiner

*Primary Examiner* — Antonio Xavier (57) ABSTRACT

A touch panel support structure that can transfer vibration of a touch panel to the operator even though a transparent protective plate is in tight contact with the surface of a case is provided. A rectangular touch panel is sandwiched at four corners between the transparent protective plate that is fixedly attached to the case near the four corners and backside support members so that the four corners act as the nodes of vibration. The antinode of waveform of vibration is located in an input operation area inside the four corners so that the touch panel can vibrate with a certain amplitude together with the transparent protective plate that covers the input operation area, even though the touch panel is fixed to the frame-like case along its periphery via the transparent protective plate, and thus vibration can be transferred to the operator.

3 Claims, 7 Drawing Sheets

(RELATED ART)

FIG.12

TOUCH PANEL SUPPORT STRUCTURE

CROSS REFERENCE TO RELATED APPLICATION

The contents of the following Japanese patent application are incorporated herein by reference,
NO. 2013-172585 filed on Aug. 22, 2013.

FIELD

The present invention relates to a support structure of a force feedback touch panel that vibrates to let the operator know that an input operation has been detected, and more particularly to a support structure for attaching the force feedback touch panel to a case.

BACKGROUND

A touch panel is a pointing device that detects an input operation when an operator's finger or a dedicated stylus/pen is brought into close proximity to an input operation area on the surface and outputs the detected positional information to a host electronic device in which the touch panel is mounted. A touch panel is usually arranged on the front side of a display panel such as a liquid crystal panel or a CRT. When an input operation is performed as guided by the contents on the display panel, the location of the input operation is output to the electronic device in connection with the displayed contents.

Various types of touch panels that detect the location of an input operation are known, such as magnetic coupling, capacitive, and resistive touch panels. Since touch panels can locate the position of an input operation from a slight touch in an input operation area, the operator sometimes cannot recognize whether or not the input operation to the touch panel has been accepted and feels uncertain about the input operation. A new type of touch panel called force feedback touch panel has been developed, which vibrates itself and allows the operator to feel the vibration via a dedicated stylus/pen or a fingertip in contact with the input operation area so as to let the operator know that an input operation to the touch panel has been detected. The applicant of the present invention has developed a force feedback touch panel that has a piezoelectric substrate fixedly and directly attached to the touch panel as an oscillatory element, so that the touch panel has a compact design and can vibrate itself efficiently (Patent Document 1).

However, when the touch panel, which vibrates itself, is attached fixedly to the case of an electronic device, the vibration is restricted by the case and may not fully be sensed by the operator. Accordingly, the applicant of the present invention has developed a touch panel support structure for mounting a touch panel, which has a fixedly attached piezoelectric substrate as an oscillatory element, to a case via a resilient support frame (Patent Document 2).

Figure 12:
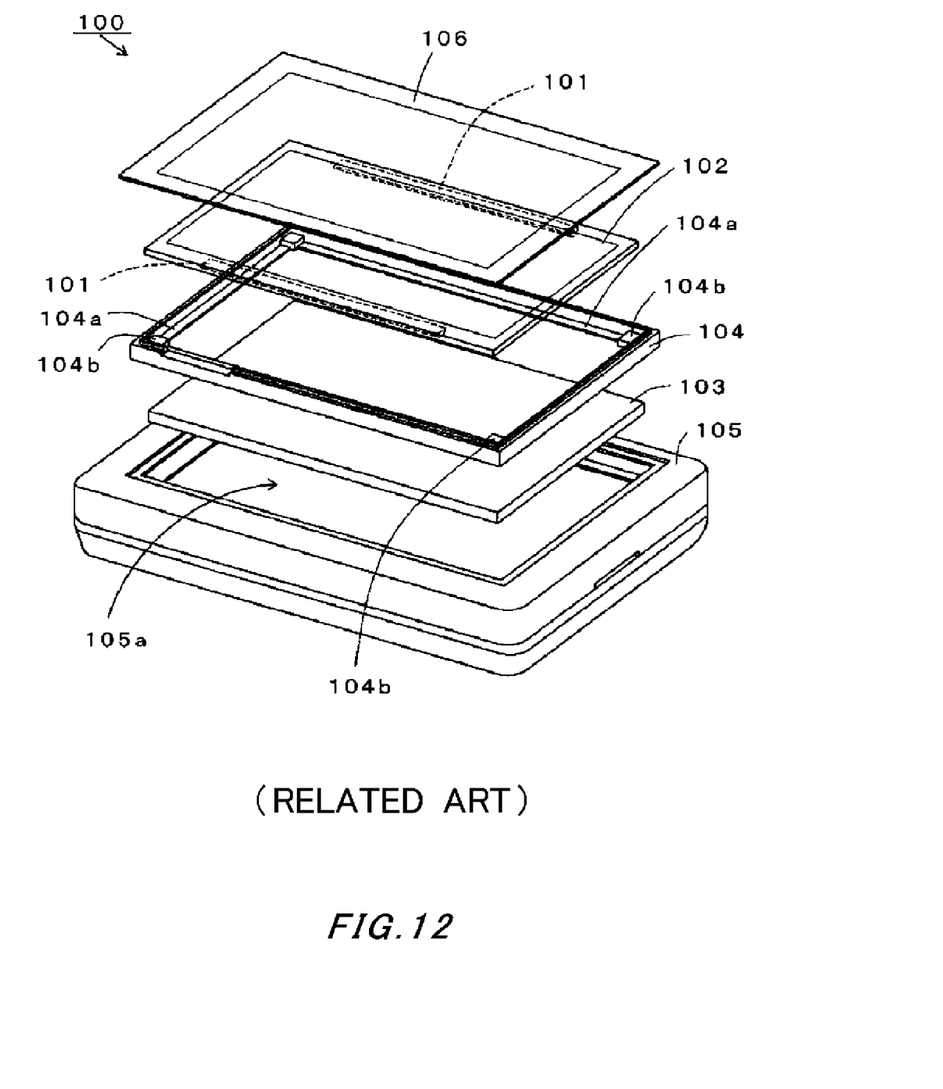
FIG. 12 is an exploded perspective view illustrating a related touch panel support structure 100.

This conventional touch panel support structure 100 will be described below with reference to FIG. 12. As shown in the drawing, the touch panel 102 having a pair of piezoelectric elements 101 firmly attached along the side edges on the back side is fitted, with a display panel 103, into and supported by a resilient support frame 104 formed in a rectangular frame shape. The resilient support frame 104 includes an integrally formed panel receiving portion 104a that extends all around the inner wall and protrudes horizontally inwards. The frame further includes integrally formed touch panel supports 104b at four corners of the panel receiving portion 104a on the front side. The touch panel 102 is supported at four corners on the touch panel supports 104b on the front side of the panel receiving portion 104a, while the display panel 103 is supported on the back side, so that the touch panel 102 is supported in parallel and above (on the front side of) the display panel 103.

The resilient support frame 104 with the touch panel 102 and the display panel 103 attached in position is secured to the edges of an opening 105a in the housing 105 of the electronic device, with the touch panel 102 exposed through the opening 105a. A transparent protective sheet 106 is then bonded over the touch panel 102 and around the opening 105a such as to cover the entire surface of the touch panel 102 and the surrounding of the opening 105a so as to prevent entrance of dust or moisture from the opening 105a.

As the touch panel 102 is mounted to the housing 105 via the resilient support frame 104 that has resiliency, and is covered with a flexible transparent sheet 106 on the front side, the touch panel 102 can freely vibrate when the piezoelectric elements 101 are driven, so that the operator can feel the vibration upon touching the transparent protective sheet 106 for an input operation.

CITATION LIST

Patent Literature

Patent Literature 1: Japanese Patent No. 3798287
Patent Literature 2: Japanese Patent No. 4811965

SUMMARY

Technical Problem

Since the conventional touch panel support structure 100 described above has a transparent protective sheet 106 in tight contact with the surface of the touch panel 102, the touch panel fails to give a high-class look because of the flexible sheet 106 covering the surface of the touch panel 102 that forms the input operation area, and also, the sheet cannot provide sufficient protection for the touch panel 102 from the impact of external force. For this reason, touch panels found in applications such as in-vehicle car navigation systems use a transparent protective plate that has a certain rigidity such as transparent acrylic sheet or glass substrate instead of the transparent protective sheet 106, which plate is firmly attached to the housing 105 along the rim to cover the surface of the touch panel 102.

However, a possible air gap between such a transparent protective plate and the touch panel 102 may degrade transmission efficiency, or cause formation of interference fringes and lower visibility of the inside display panel. Moreover, when the touch panel 102 vibrates, it may make unnecessary noise as it collides with the transparent protective plate. Therefore, the entire surface of the touch panel 102 is bonded with a transparent adhesive to the transparent protective plate so that they make tight contact with each other. As the touch panel 102 is fixed to the housing 105 via the transparent protective plate that has a certain rigidity, its vibration is restricted, so that there was a possibility that the vibration could not be sufficiently transferred to the operator.

The present invention was made in consideration of these problems in the conventional technology, and it is an object of the invention to provide a touch panel support structure that can transfer vibration of the touch panel to the operator even though the touch panel has a transparent protective plate tightly in contact with its surface and the case.

Solution to Problem

To achieve the above object, the touch panel support structure according to a first aspect includes a display panel, a rectangular touch panel that is arranged on a front side of the display panel and detects an input operation made to an input operation area parallel to the display panel, a frame-like case that supports the touch panel such that the input operation area is located inside an opening of the case, and an oscillatory element fixedly attached to a backside of the touch panel, the oscillatory element being controlled and driven to vibrate the touch panel when an input operation is detected, wherein the support structure further includes a transparent protective plate fixedly attached to the entire surface of the touch panel and the rim of the opening of the case and covering the surface of the touch panel, and a backside support member integrally formed on an inner wall of the opening for supporting the touch panel from a backside in four corner portions of the rectangular touch panel, so that the touch panel is sandwiched at four corners between the transparent protective plate fixedly attached to the case near the four corners and the backside support member.

The four corners of the rectangular touch panel are sandwiched between the transparent protective plate that is fixed to the case and the backside support member, and vibration of the touch panel is restricted there in the up and down direction. The four corners act as the nodes of the vibration generated by the oscillatory element, while the inside input operation area can deform as the antinode. Accordingly, although the touch panel is fixed to the frame-like case along its periphery via the transparent protective plate, the input operation area surrounded by the four corners of the touch panel can vibrate with a certain amplitude together with the transparent protective plate that covers the input operation area, and thus the vibration is transferred to the operator.

In the touch panel support structure according to a second aspect, the opening is formed in a rectangular shape for the touch panel to fit in loosely, and the backside support member is made up of plate spring pieces integrally formed to the inner wall near the four corners of the rectangular opening.

As the touch panel is supported from the backside at four corners with the plate spring pieces, the four corners of the touch panel are sandwiched between the plate spring pieces and the transparent protective plate such as to be displaceable, so that they can act similarly to rotating ends.

In the touch panel support structure according to a third aspect, the plate spring pieces are formed in an L shape extending along the inner wall at four corners such that their both ends are integrally connected and supported on the inner wall near the four corners of the opening.

The plate spring pieces thus have a predetermined length of spring span from both ends that are integrally supported on the inner wall to the respective corners of the L-shape, where the plate spring pieces support the four corners of the touch panel from the backside.

In the touch panel support structure according to a fourth aspect, a first resilient support member is arranged between the backside support member and the touch panel at four corners.

The first resilient support member provided between the touch panel and the backside support member absorbs displacement of the touch panel caused by vibration at four corners to prevent a large reactive force from being applied from the backside support member to the touch panel.

In the touch panel support structure according to a fifth aspect, a second resilient support member is arranged between a portion on the backside of the backside support member that supports the touch panel at four corners and the display panel.

As the vibration of the touch panel at four corners is absorbed by deformation of the second resilient support member that is arranged between the backside support member and the display panel, the four corners of the touch panel are allowed to move and can act as rotating ends.

According to the invention of the first aspect, even though the transparent protective plate, which is fixed to the case along its periphery, is in tight contact with the surface of the touch panel, part of the transparent protective plate covering the input operation area of the touch panel can vibrate with a certain amplitude, so that the vibration of the touch panel is reliably transferred to the operator.

Since the transparent protective plate covering the touch panel has a certain rigidity, it protects the input operation area of the touch panel from external force.

Also, since the transparent protective plate is fixedly attached to the rim of the opening in the case along its periphery, it can reliably prevent entrance of moisture or dust through the opening.

According to the invention of the second aspect, the four corners of the touch panel are allowed to move so that vibration is not attenuated, and can act as the nodes of vibration.

According to the invention of the third aspect, the plate spring pieces do not provide a large spring force to a certain amount of displacement of the touch panel at four corners caused by vibration, so that the vibration of the touch panel is not attenuated at the four corners.

As the plate spring pieces have a sufficiently long spring span from the fixed ends integral with the inner wall to the respective corners of the L-shape where the plate spring pieces support the four corners of the touch panel, no large bending stress is generated, so that they are unlikely to break even if they are subjected to an unexpected external force caused by depression of the entire touch panel, for example.

According to the invention of the fourth aspect, the displacement at four corners of the touch panel caused by vibration is absorbed by the first resilient support member that is arranged between the touch panel and the backside support member, so that the vibration of the touch panel is not attenuated at the four corners.

Even if the touch panel is depressed unexpectedly largely at four corners when the entire touch panel is pressed down, for example, the first resilient support member can absorb the displacement as it is compressed, and protects the backside support member from damage by preventing a large external force from being applied to the backside support member.

According to the invention of the fifth aspect, any assembling errors in the distance between the display panel and the backside support member can be absorbed by deformation of the second resilient support member, so that the backside support member and the second resilient support member can reliably provide support for the backside of the touch panel at four corners.

Even if the touch panel is depressed largely at four corners when the entire touch panel is pressed down, for example, the backside support member and the second resilient support member between the touch panel and the display panel provide support and prevent large displacement or damage of the backside support member.

DESCRIPTION OF EMBODIMENTS

A touch panel support structure 1 according to one embodiment of the present invention will be hereinafter described with reference to FIG. 1 to FIG. 11. The touch panel 3 is used as an input device of various types of electronic equipment such as mobile information terminal devices, mobile phones, car navigation systems, and so on. The touch panel may be attached to a case 2 that forms the housing of, for example, a car navigation system. The case 2 made of a synthetic resin is made up of a frame-like upper case 2A to which the touch panel 3 is mounted, and a lower case 2B in the shape of a box for mounting a liquid crystal display panel 4 that displays maps, icons, and the like. The upper and lower cases are fastened together with screws so that the touch panel 3 is disposed in parallel and above the liquid crystal display panel 4. In the following description of various parts, the upper side in FIG. 1 will be referred to as the front side, and the lower or bottom side as the backside.

The touch panel 3 is a capacitive touch panel and more specifically a mutual capacitance touch panel, which detects the location of an input operation made to an input operation area on the surface. A multiplicity of electrodes are arranged in matrix in the input operation area on an insulating substrate. When an inputting object such as a fingertip approaches, the location of this input operation is detected by determining the position of the electrode where a change in capacitance between electrodes occurred. Therefore, although the touch panel 3 is illustrated as a single rectangular panel in various drawings, it is actually formed by an insulating substrate, a multiplicity of electrodes arranged on the insulating substrate, and a protection substrate for covering and protecting the surface of the electrodes, all of which are made of a transparent material, laminated upon one another.

A pair of piezoelectric substrates 5 that are oscillatory elements are attached to the backside of the touch panel 3. The piezoelectric substrates 5 are formed in thin and long strips and have a set of driving electrodes on each of the front and back sides. The front surface is entirely fixed to the backside of the touch panel 3 with an adhesive or the like. The touch panel 3 is made to vibrate by the electrostrictive effect in the piezoelectric substrates 5, i.e., a voltage is applied to the pair of driving electrodes to contract and expand the piezoelectric substrates 5, and the strain in the piezoelectric substrates 5 is transmitted to the touch panel 3 in tight contact therewith as vibration.

Figure 7:
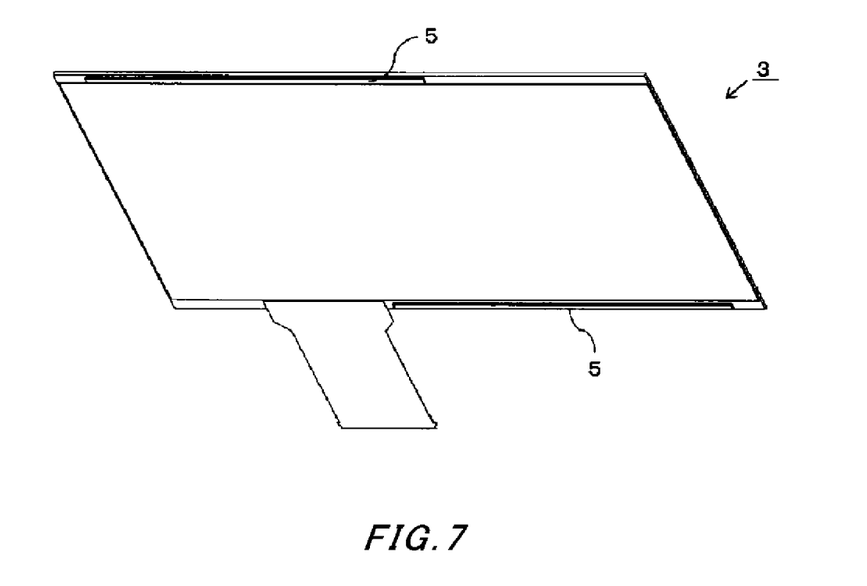
FIG. 7 is a perspective view of the touch panel 3 viewed from the backside.

As the piezoelectric substrates 5 are formed in thin and long strips, they can generate vibration of a larger amplitude with a smaller amount of material. By firmly attaching such thin, long strips of piezoelectric substrates 5 along the longitudinal direction of the rectangular touch panel 5 rather than along the short sides of the rectangle, they can make the touch panel 3 to vibrate with a larger amplitude. The pair of piezoelectric substrates 5 are fixedly attached to portions on the backside of the touch panel 3 along both sides in the longitudinal direction, as shown in FIG. 7, so that they will not obstruct detection of the location of an input operation in the input operation area, and not block the displayed contents on the liquid crystal display panel arranged below. Note, however, that such an attachment layout of the piezoelectric substrates 5 is only one example and it should not be limited to this particular example.

Figure 5:
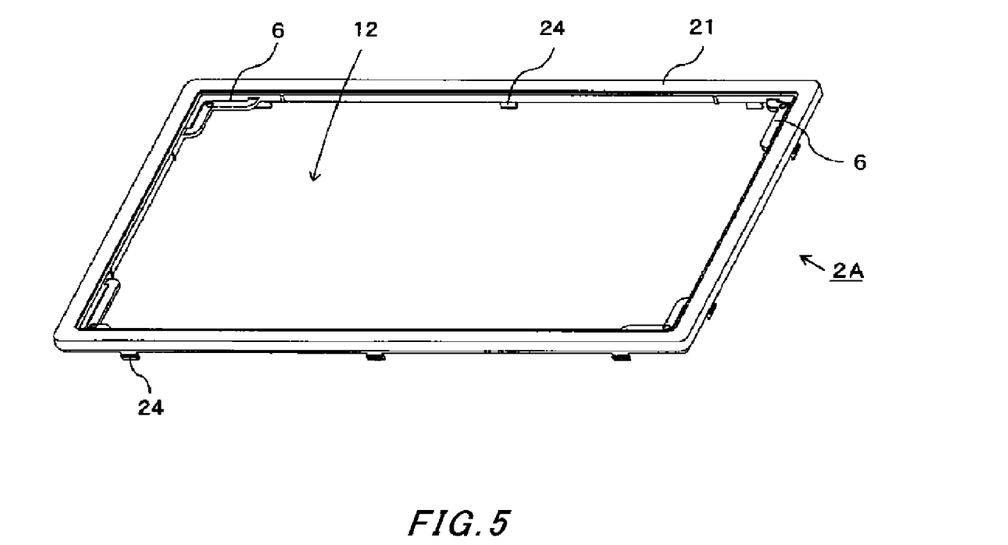
FIG. 5 is a perspective view of an upper case 2A.
Figure 6:
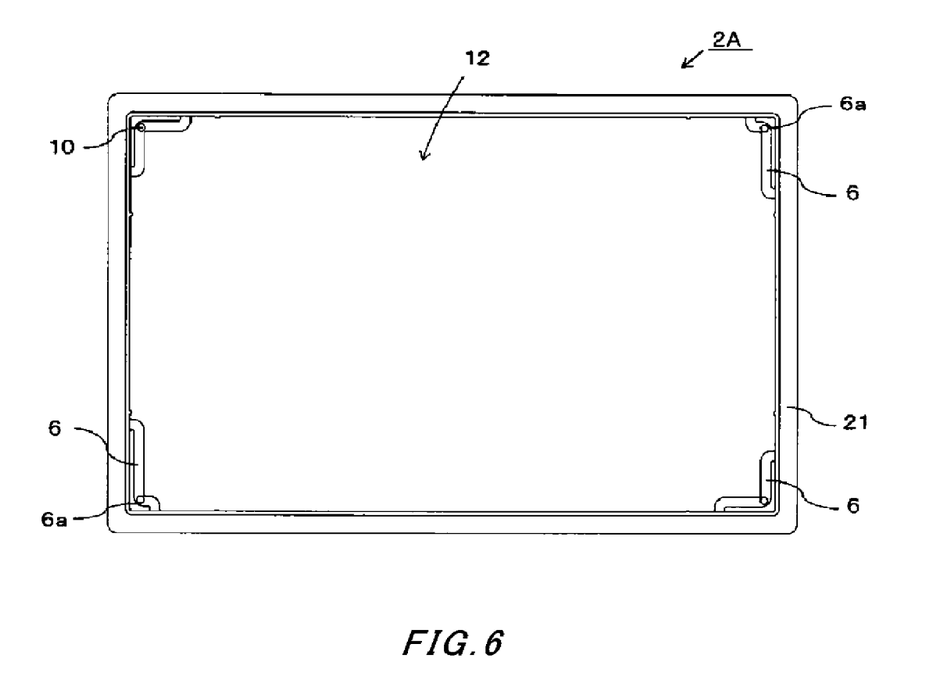
FIG. 6 is a plan view of the upper case 2A.

The upper case 2A to which the touch panel 3 is attached has a rectangular frame 21 in the form of a horizontally oriented rectangle as shown in FIG. 5 and FIG. 6. The opening 12 surrounded by the rectangular frame 21 is of a size that allows the touch panel 3 to loosely fit in so that the input operation area on the surface of the touch panel 3 will be located inside the opening 12. Backside support members 6 that support four corners of the rectangular touch panel 3 from the backside are integrally formed at four inside corners of the rectangular frame 21. The backside support members 6 in this example are L-shaped plate spring pieces as can be seen from the enlarged view in FIG. 4 that extend along the inner wall at four inside corners of the rectangular frame 21. Both ends of the plate spring pieces 6 are integrally and fixedly connected to the inner wall of the rectangular frame 21 and supported parallel to the backside of the touch panel 3.

Bent portions of the L-shaped plate spring pieces 6 form pressure receiving portions 6a that support the four corners of the touch panel 3. Upper resilient spacers 10 are provided between the pressure receiving portions 6a and the touch panel 3, with their front and back sides bonded to the front surface of the pressure receiving portions 6a and the back surface of four corners of the touch panel 3, respectively.

A transparent protective plate 8 is laminated on the front side of the touch panel 3. The transparent protective plate 8 and the touch panel 3 are fixedly joined in tight contact with each other with a transparent adhesive 9 applied on the entire front surface of the touch panel 3 and the backside of the plate 8. The transparent protective plate 8 is made of a transparent material that has a certain rigidity for protecting the touch panel 3 from external force and resiliency to be able to vibrate with the touch panel 3. The plate 8 may be a glass plate, transparent synthetic resin plate, or the like. Here, the plate 8 is formed from a transparent acrylic plate.

The transparent acrylic plate 8 is in the form of a horizontally oriented rectangle having the same outline as that of the upper case 2A, and fixedly bonded to the upper case 2A with an adhesive along its periphery on the backside around the bonded touch panel 3 on the surface of the rectangular frame 21. This bonding is achieved by applying the transparent adhesive 9 used for the bonding of the touch panel 3 over the entire backside of the transparent acrylic plate 8 during the process of bonding the touch panel 3. However, since the adhesive for bonding the plate with the upper case 2A need not necessarily be transparent, a different adhesive may be used, or the transparent acrylic plate 8 may be fixedly attached to the upper case 2A by other fixing means such as ultrasonic welding.

As the transparent acrylic plate 8 is fixedly attached along its periphery to the surface of the rectangular frame 21, the touch panel 3 is supported on the rectangular frame 21 via the one-piece transparent acrylic plate 8 on the front side, while it is supported at four corners by the plate spring pieces 6 via the upper resilient spacers 10 on the backside. As the periphery of the opening 12 is completely sealed by the transparent acrylic plate 8 and the rectangular frame 21 bonded together, no moisture or dust can enter the opening 12.

Figure 9:
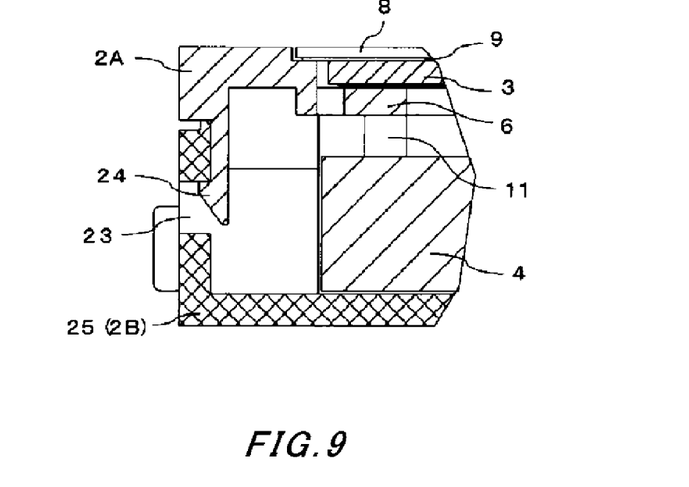
FIG. 9 is a cross section along line B-B of FIG. 2.
Figure 10:
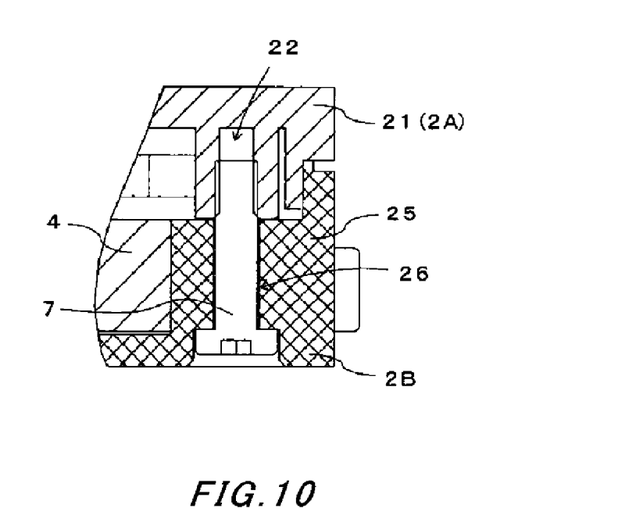
FIG. 10 is a cross section along line C-C of FIG. 2.

On the backside at four corners of the rectangular frame 21 of the upper case 2A are formed holes with internal threads 22, as shown in FIG. 10, which each mate with externally threaded screws 7 driven into the holes from the backside of the lower case 2B. On both sides and spaced away from the internally threaded hole 22 at each of the four corners, and in the midpoint in the longitudinal direction of the rectangular frame 21, provided are engaging protrusions 24 to extend downward from the backside of the frame, for engagement with windows 23 in the lower case 2B, as shown in FIG. 9.

The rectangular frame 25 that forms the sides of the box-shaped lower case 2B has the same horizontally oriented rectangular outline as that of the upper case 2A. The frame 25 has insertion holes 26 and windows 23 drilled in corresponding portions below the internally threaded holes 22 and engaging protrusions 24 of the upper case 2A. Thus the upper case 2A and the lower case 2b are fastened to each other at four corners with the externally threaded screws 7, with the engaging protrusions 24 engaging with the windows 23 to retain the upper case 2A on top of the lower case 2B.

The upper case 2A is made of a synthetic resin that is resiliently deformable to the extent that it can transmit detectable vibration. Since the upper case 2A is fixed to the lower case 2B at both ends of the short sides of the rectangular frame 25 while it is retained at both ends in the longitudinal direction by the engagement between the engaging protrusions 24 and windows 23, it does not suppress vibration whose waveform extends along the longitudinal direction of the touch panel 3 caused by expansion and contraction of the piezoelectric substrates 5 fixedly attached in thin and long strips along the longitudinal direction.

Figure 8:
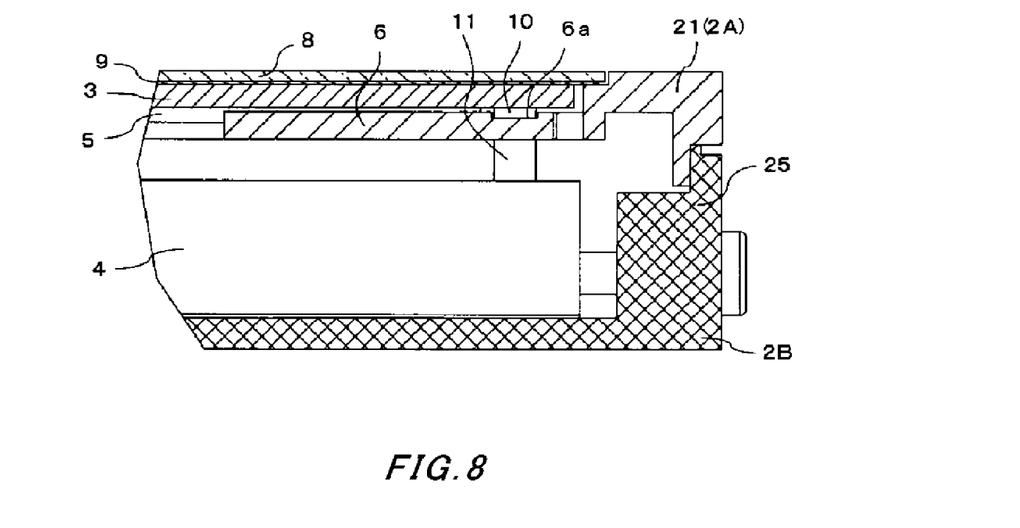
FIG. 8 is a cross section along line A-A of FIG. 2.

Inside the lower case 2B that is formed in a rectangular box shape, arranged are the liquid crystal display panel 4, driver elements of the liquid crystal display panel 4, and other electronic components, as well as lower resilient spacers 11, with their front and back sides bonded to the front surface of the liquid crystal display panel 4 and the back surface of the pressure receiving portions 6a of the plate spring pieces 6, respectively, as shown in FIG. 8. Thus, the pressure receiving portions 6a of the plate spring pieces 6 that support the four corners of the touch panel 3 are supported on the fixed liquid crystal display panel 4 via the lower resilient spacers 11.

The touch panel 3 is attached to the case 2 with the configuration described above, such that the input operation area is located inside the opening 12 of the upper case 2A. When the touch panel 3 detects an input operation in the input operation area, a drive voltage is applied to the pair of piezoelectric substrates 5 fixedly attached to the backside of the touch panel 3, whereupon the entire touch panel 3 and the transparent acrylic plate 8 vibrate. This allows the operator to realize through the inputting object such as a finger in contact with the transparent acrylic plate 8 that the input operation has been received.

The touch panel 3 and the transparent acrylic plate 8 vibrate with a larger amplitude in the longitudinal direction than along the short sides of the touch panel 3 because the thin and long strips of piezoelectric substrates 5 are fixedly attached along the long sides of the touch panel 3 and because the upper case 2A attached around the transparent acrylic plate 8 is not retained in the longitudinal direction. Rotation of the touch panel 3 is not strictly prohibited, as the touch panel 3 is supported on the upper resilient spacers 10 and the plate spring pieces 6 at four corners together with the transparent acrylic plate 8 fixed to the upper case 2A near the four corners. Accordingly, the amplitude of vibration is limited in the vertical direction due to the spring effect of the upper resilient spacers 10 and the plate spring pieces 6 acting oppositely from the direction of vibration acceleration.

Furthermore, since the pressure receiving portions 6a of the plate spring pieces 6 that support the four corners of the touch panel 3 are supported such as to be kept at a constant height on the liquid crystal display panel 4 arranged on the side of the fixed lower case 2B via the lower resilient spacers 11, the touch panel 3 is also supported such that it is maintained at the same height at the four corners by the pressure receiving portions 6a of the plate spring pieces 6.

Namely, the four corners of the touch panel 3 can freely rotate but are restricted from moving up and down, and function similarly to rotating ends (hinge pivots), to act as the nodes of the vibration of the touch panel 3 vibrating in the longitudinal direction. The input operation area away from the four corners acts as the antinode of the vibration, so that the vibration has a large amplitude and can be transferred to the operator.

Figure 1:
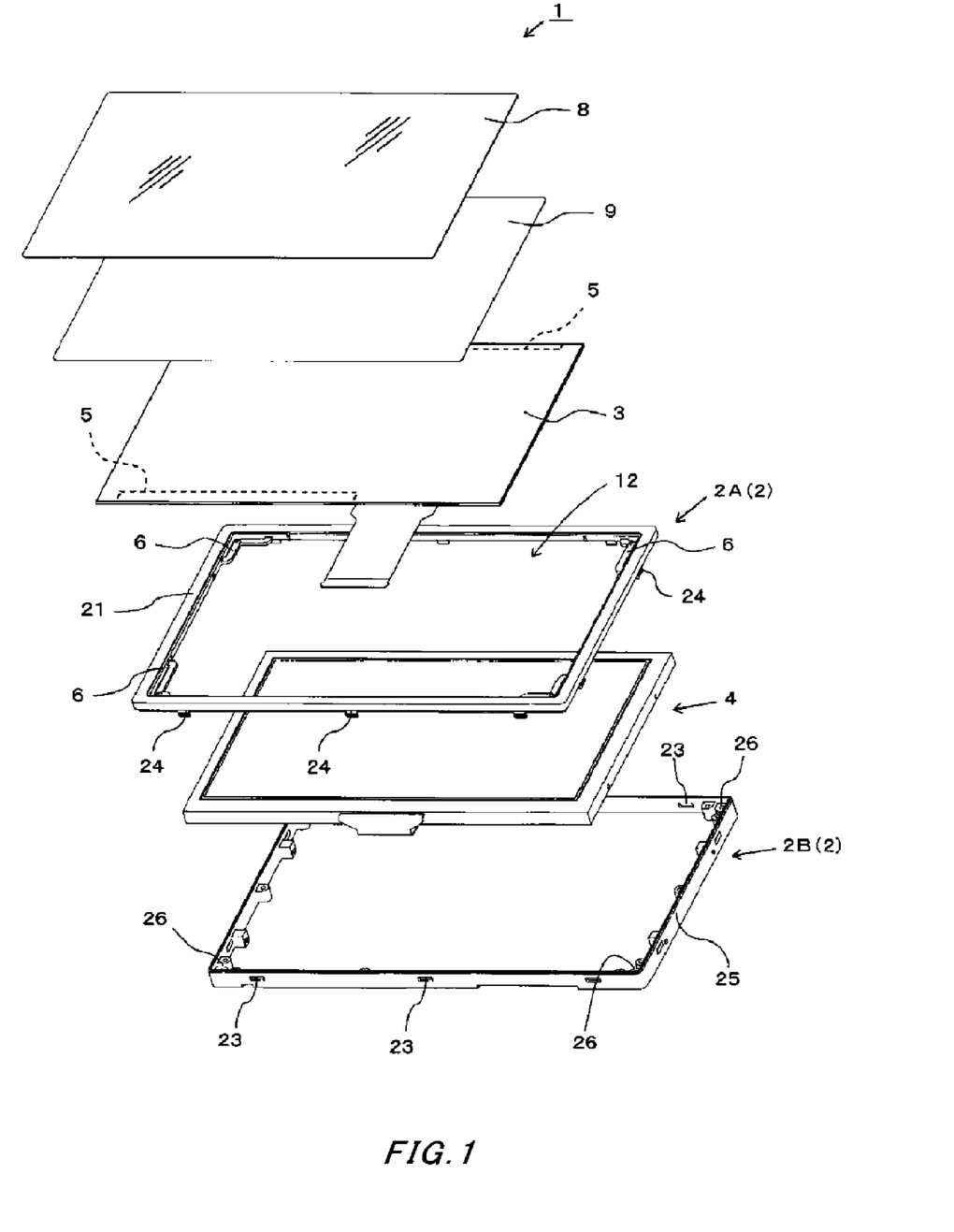
FIG. 1 is an exploded perspective view of a touch panel support structure 1 according to one embodiment of the present invention.
Figure 2:
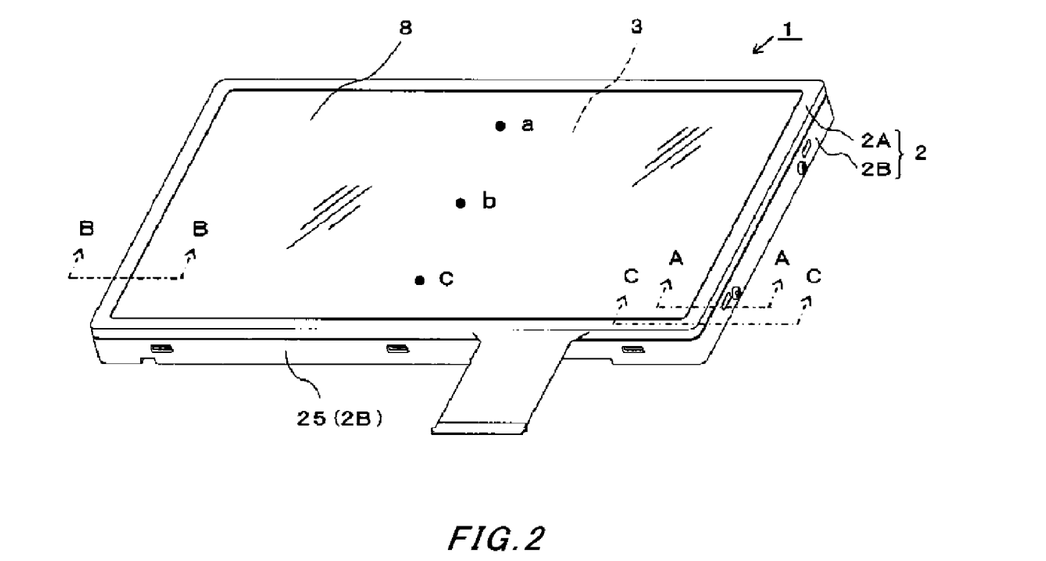
FIG. 2 is a perspective view of a case 2 to which a touch panel 3 is attached.
Figure 3:
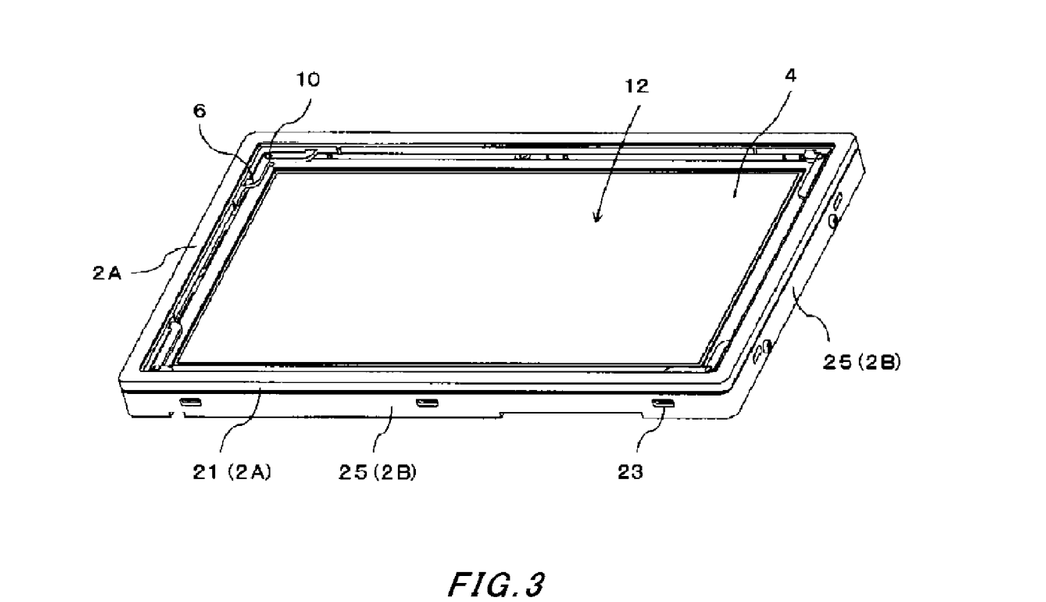
FIG. 3 is a perspective view of the case 2 to which a display panel 4 is attached.
Figure 4:
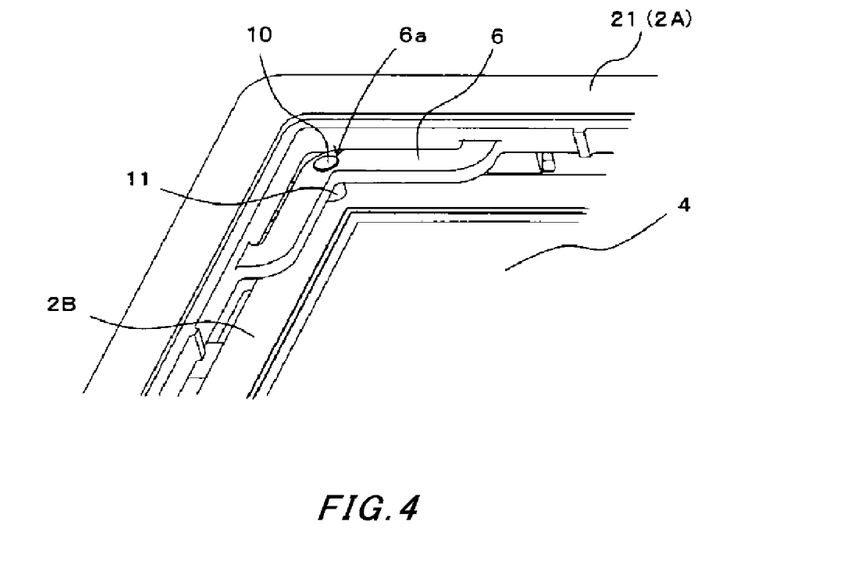
FIG. 4 is a view showing essential parts of FIG. 3 to a larger scale.
Figure 11:
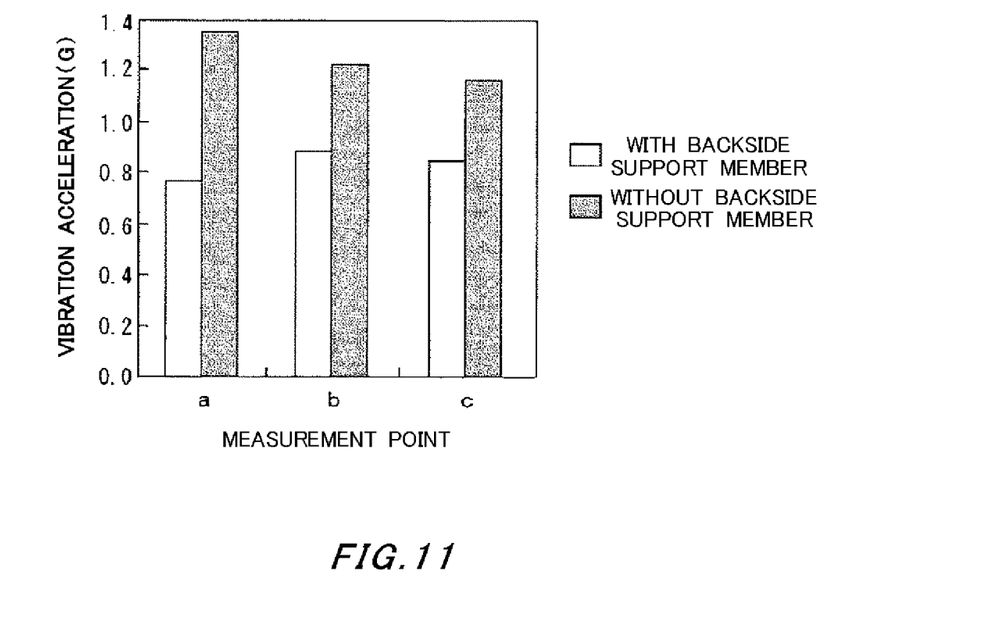
FIG. 11 is a graph comparing vibration acceleration measured at positions a, b, and c in FIG. 2 when piezoelectric elements 5 are driven, between a touch panel with a backside support member 6 and a touch panel without the backside support member 6.

FIG. 11 is a graph showing the vibration acceleration in the vertical direction at positions a, b, and c in FIG. 2 when the piezoelectric elements 5 are driven to vibrate the touch panel 3, comparing the case where the touch panel 3 is supported without any backside support members such as the plate spring pieces 6, upper resilient spacers 10, and lower resilient spacers 11 (touch panel without backside support members) and the case where the touch panel is supported by the backside support members as in the embodiment (touch panel with backside support members). As shown from the graph, vibration at each position a, b, or c is not attenuated when the touch panel 3 is supported with backside support members.

While the plate spring pieces 6 are supported between the upper resilient spacers 10 and the lower resilient spacers 11 in the embodiment described above, one or both of the spacers 10 and 11 may be omitted. The upper resilient spacers 10 may preferably be provided in order to prevent knocking noise between the touch panel 3 and the plate spring pieces 6 when the touch panel 3 vibrates.

While the plate spring pieces 6 are formed in an L-shape extending along the inner wall at four inside corners of the rectangular frame 21 so as to support the four corners of the touch panel 3 with a sufficiently long spring span, the plate spring pieces may be formed in other shapes such as a U-shape.

The touch panel 3 in the above-described embodiment is described as a capacitive touch panel, but it may also be other types of touch panels that detect the location of an input operation such as a resistive touch panel or a magnetic coupling touch panel or the like.

INDUSTRIAL APPLICABILITY

The present invention is suitably applied as a touch panel support structure for protecting the surface of a force feedback touch panel with a transparent protective plate that has a certain rigidity.

REFERENCE SIGNS LIST

1 Touch panel support structure
2 Case
3 Touch panel
4 Liquid crystal display panel (display panel)

5 Piezoelectric substrate (oscillatory element)
6 Plate spring piece (backside support member)
8 Transparent acrylic plate (transparent protective plate)
10 Upper resilient spacer (first resilient support member)
11 Lower resilient spacer (second resilient support member)
12 Opening

The invention claimed is:

1. A touch panel support structure comprising:
a display panel;
a touch panel that is arranged on a front side of the display panel and detects an input operation made to an input operation area parallel to the display panel, the touch panel being formed in a rectangular shape;
a frame-like case that supports the touch panel such that the input operation area is located inside an opening of the case, the opening being formed in a rectangular shape for the touch panel to fit in loosely;
an oscillatory element fixedly attached to a backside of the touch panel, the oscillatory element being controlled and driven to vibrate the touch panel when an input operation is detected;
a transparent protective plate fixedly attached to the entire surface of the touch panel and a rim of the opening of the case, the transparent protective plate covering the surface of the touch panel; and
a backside support member that is made up of plate spring pieces integrally formed to an inner wall near four corners of the opening for supporting the touch panel from a backside in four corners of the touch panel, so that the touch panel is sandwiched at the four corners of the touch panel between the transparent protective plate fixedly attached to the case near the four corners of the touch panel and the backside support member, the plate spring pieces being formed in an L shape extending along the inner wall at the four corners of the opening such that both ends thereof are integrally connected and supported on the inner wall near the four corners of the opening.

2. The touch panel support structure according to claim 1, comprising a first resilient support member that is arranged between the backside support member and the touch panel at the four corners of the touch panel.

3. The touch panel support structure according to claim 1, comprising a second resilient support member that is arranged between a portion on the backside of the backside support member that supports the touch panel at the four corners of the touch panel and the display panel.

* * * * *